(12) United States Patent
Yifrach et al.

(10) Patent No.: US 10,310,585 B2
(45) Date of Patent: Jun. 4, 2019

(54) REPLACEMENT PHYSICAL LAYER (PHY) FOR LOW-SPEED PERIPHERAL COMPONENT INTERCONNECT (PCI) EXPRESS (PCIE) SYSTEMS

(71) Applicant: QUALCOMM Incorporated, San Diego, CA (US)

(72) Inventors: Shaul Yohai Yifrach, Haifa (IL); Amit Gil, Zichron Yaakov (IL); James Lionel Panian, San Diego, CA (US); Ofer Rosenberg, San Diego, CA (US); Richard Dominic Wietfeldt, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/726,566

(22) Filed: Oct. 6, 2017

(65) Prior Publication Data

US 2018/0120921 A1    May 3, 2018

Related U.S. Application Data

(60) Provisional application No. 62/413,499, filed on Oct. 27, 2016.

(51) Int. Cl.
*G06F 1/32* (2019.01)
*G06F 13/42* (2006.01)
(Continued)

(52) U.S. Cl.
CPC ........ *G06F 1/3253* (2013.01); *G06F 13/4072* (2013.01); *G06F 13/4273* (2013.01);
(Continued)

(58) Field of Classification Search
CPC . G06F 13/4282; G06F 13/4221; G06F 1/3253
See application file for complete search history.

(56) References Cited

U.S. PATENT DOCUMENTS 7,007,115 B2 *  2/2006  Elboim .................. G06F 13/102
                                                      375/372
8,856,573 B2 * 10/2014  Meir ..................... G06F 13/423
                                                      710/106
(Continued)

FOREIGN PATENT DOCUMENTS

WO        2014171937 A1    10/2014

OTHER PUBLICATIONS

Intel Corporation—"PHY Interface for the PCI Express Architecture—Version 2.00"; 38 pages, Dated 2007 (Year: 2007).*
(Continued)

*Primary Examiner* — Brian T Misiura
(74) *Attorney, Agent, or Firm* — Withrow & Terranova, PLLC

(57) ABSTRACT

A replacement physical layer (PHY) for low-speed Peripheral Component Interconnect (PCI) Express (PCIe) systems is disclosed. In one aspect, an analog PHY of a conventional PCIe system is replaced with a digital PHY. The digital PHY is coupled to a media access control (MAC) logic by a PHY interface for PCIe (PIPE) directly. In further exemplary aspects, the digital PHY may be a complementary metal oxide semiconductor (CMOS) PHY that includes a serializer and a deserializer. Replacing the analog PHY with the digital PHY allows entry and exit from low-power modes to occur much quicker, resulting in substantial power savings and reduced latency. Because the digital PHY is operable with low-speed communication, the digital PHY can maintain sufficient bandwidth that communication is not unnecessarily impacted by digital logic of the digital PHY.

19 Claims, 9 Drawing Sheets

(51) Int. Cl.
  *G06F 1/3234* (2019.01)
  *G06F 13/40* (2006.01)
  *H01L 23/29* (2006.01)
  *H04L 12/931* (2013.01)

(52) U.S. Cl.
  CPC ........ *G06F 13/4291* (2013.01); *H01L 23/291* (2013.01); *H04L 49/40* (2013.01); *Y02D 10/151* (2018.01)

(56) References Cited

U.S. PATENT DOCUMENTS

| | | | |
|---|---|---|---|
| 9,009,379 B1* | 4/2015 | Marena | G06F 13/4286 710/308 |
| 9,477,630 B2 | 10/2016 | Reinke et al. | |
| 9,575,552 B2* | 2/2017 | Por | G06F 1/266 |
| 9,720,866 B2* | 8/2017 | Hamada | G06F 13/4282 |
| 9,766,692 B2* | 9/2017 | Dabral | G06F 1/3296 |
| 2012/0068735 A1 | 3/2012 | Harriman et al. | |
| 2013/0346665 A1* | 12/2013 | Freking | G06F 9/4411 710/313 |
| 2015/0046626 A1 | 2/2015 | Cowell | |
| 2015/0186319 A1 | 7/2015 | Blevins et al. | |
| 2015/0205745 A1 | 7/2015 | Bailey et al. | |
| 2015/0269108 A1 | 9/2015 | Spry et al. | |
| 2015/0269109 A1 | 9/2015 | Spry et al. | |
| 2015/0370315 A1 | 12/2015 | Unnikrishnan et al. | |
| 2016/0216758 A1 | 7/2016 | Kachare et al. | |
| 2017/0039162 A1* | 2/2017 | Mishra | G06F 13/4282 |
| 2017/0083079 A1 | 3/2017 | Chin et al. | |
| 2017/0127465 A1 | 5/2017 | McCormack et al. | |
| 2017/0200482 A1 | 7/2017 | Fox et al. | |

OTHER PUBLICATIONS

International Search Report and Written Opinion for PCT/US2017/055726, dated Jan. 16, 2018, 13 pages.
Second Written Opinion for PCT/US2017/055726, mailed Sep. 25, 2018, 7 pages.
International Preliminary Report on Patentability for PCT/US2017/055726, dated Feb. 6, 2019, 8 pages.

* cited by examiner

REPLACEMENT PHYSICAL LAYER (PHY) FOR LOW-SPEED PERIPHERAL COMPONENT INTERCONNECT (PCI) EXPRESS (PCIE) SYSTEMS

PRIORITY CLAIM

The present application claims priority to U.S. Provisional Patent Application Ser. No. 62/413,499 filed on Oct. 27, 2016 and entitled "REPLACEMENT PHYSICAL LAYER (PHY) FOR LOW-SPEED PERIPHERAL COMPONENT INTERCONNECT (PCI) EXPRESS (PCIE) SYSTEMS," the contents of which is incorporated herein by reference in its entirety.

BACKGROUND

I. Field of the Disclosure

The technology of the disclosure relates generally to a physical layer (PHY) interface for a Peripheral Component Interconnect (PCI) Express (PCIe) communication bus.

II. Background

Computing devices have become prevalent in modern society. The increasing popularity of such devices is driven in part by the increasing processing power of such devices as well as the increasing flexibility of such devices. Such increased power and flexibility is frequently achieved by providing multiple integrated circuits (ICs) within the computing device. These ICs communicate with one another through a physical medium such as a copper wire on a circuit board using a predefined protocol such as Peripheral Component Interconnect (PCI) Express (PCIe).

Many computing devices, particularly mobile computing devices such as smart phones, also have a strong interest in power conservation to extend battery life. Accordingly, many elements, including the PCIe communication links, support low-power modes according to the defined standards. Part of the popularity of the PCIe protocol is based on the fact that PCIe is engineered to support a variety of speeds including speeds as high as plural gigabits per second.

While the PCIe protocol is capable of supporting high speeds, it also is used to support low-speed links. For example, a wireless modem supporting Internet of Things (IoT) devices may operate in the megabits per second range. When the normal power-saving techniques are applied to such low-speed communications, the expected power savings are not fully realized because substantial power is consumed exiting and entering the low-power mode compared to the amount of time spent actually transmitting data. Accordingly, there remains a need for a better way for low-speed PCIe communications to be effectuated to provide greater power savings.

SUMMARY OF THE DISCLOSURE

Aspects disclosed in the detailed description include a replacement physical layer (PHY) for low-speed Peripheral Component Interconnect (PCI) Express (PCIe) systems. In an exemplary aspect, an analog PHY of a conventional PCIe system is replaced with a digital PHY. The digital PHY is coupled to a media access control (MAC) logic by a PHY interface for PCIe (PIPE) directly. In further exemplary aspects, the digital PHY may be a complementary metal oxide semiconductor (CMOS) PHY that includes a serializer and a deserializer. Replacing the analog PHY with the digital PHY allows entry and exit from low-power modes to occur much quicker, resulting in substantial power savings and reduced latency. Because the digital PHY is operable with low-speed communication, the digital PHY can maintain sufficient bandwidth that communication is not unnecessarily impacted by digital logic of the digital PHY.

In this regard in one aspect, an integrated circuit (IC) having only a digital PHY for PCI communications is disclosed. The IC includes a PCIe MAC logic. The IC also includes a PIPE communicatively coupled to the PCIe MAC logic. The IC also includes the digital PHY directly communicatively coupled to the PIPE and configured to be coupled to a bus for low-speed communication.

In another aspect, a method of communicating over a bus is disclosed. The method includes generating a plurality of data signals at a MAC logic. The method also includes passing the plurality of data signals through a PIPE to a digital PHY. The method also includes transmitting a digital signal over a low-speed communication bus.

In another aspect, an IC having only a digital PHY for PCI communications is disclosed. The IC includes a PCIe MAC logic. The IC also includes a PIPE communicatively coupled to the PCIe MAC logic. The IC also includes a means for sending digital signals to a low-speed communication bus, the means for sending directly communicatively coupled to the PIPE.

DETAILED DESCRIPTION

Figure 1:
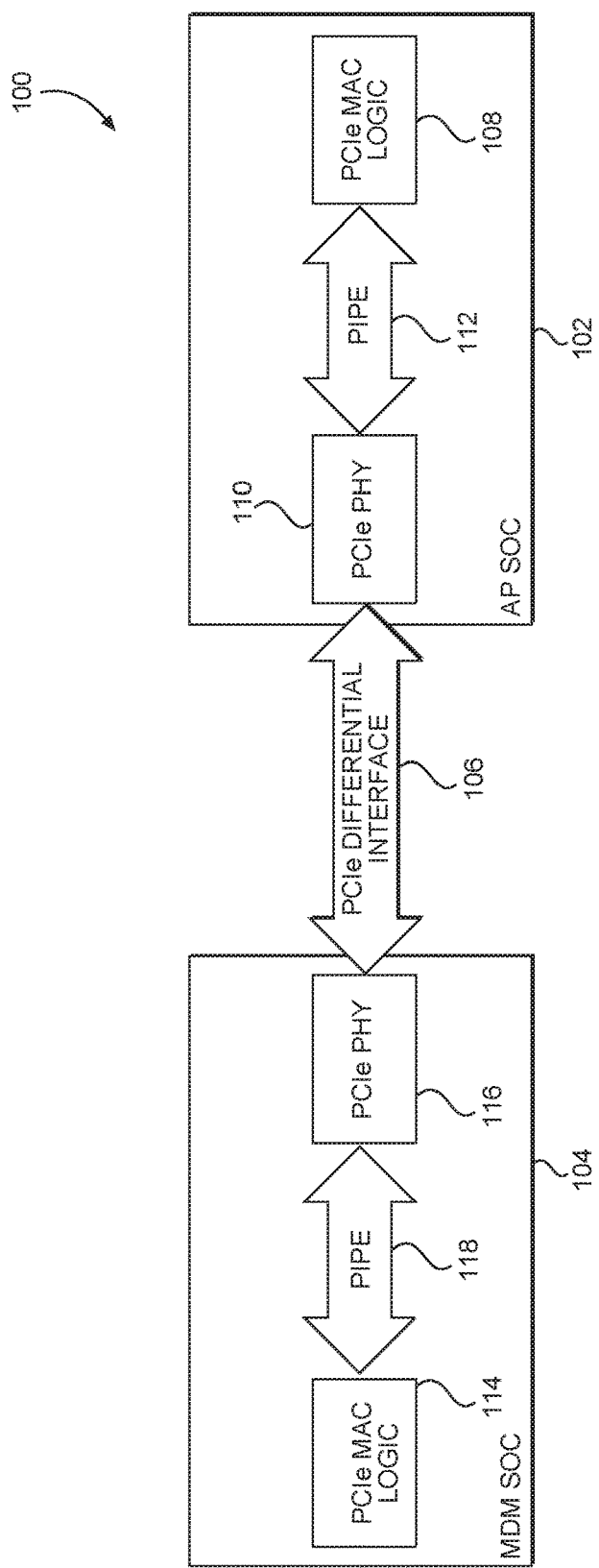
FIG. 1 is a block diagram of a conventional Peripheral Component Interconnect (PCI) Express (PCIe) system with two integrated circuits (ICs) coupled to one another across a PCIe bus.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a replacement physical layer (PHY) for low-speed Peripheral Component Interconnect (PCI) Express (PCIe) systems. In an exemplary aspect, an analog PHY of a conventional PCIe system is replaced with a digital PHY. The digital PHY is coupled to a media access control (MAC) logic by a PHY interface for PCIe (PIPE) directly. In further exemplary aspects, the digital PHY may be a complementary metal oxide semiconductor (CMOS) PHY that includes a serializer and a deserializer. Replacing the analog PHY with the digital PHY allows entry and exit from low-power modes to occur much quicker, resulting in substantial power savings and reduced latency. Because the digital PHY is operable with low-speed communication, the digital PHY can maintain sufficient bandwidth that communication is not unnecessarily impacted by digital logic of the digital PHY.

Figure 2:
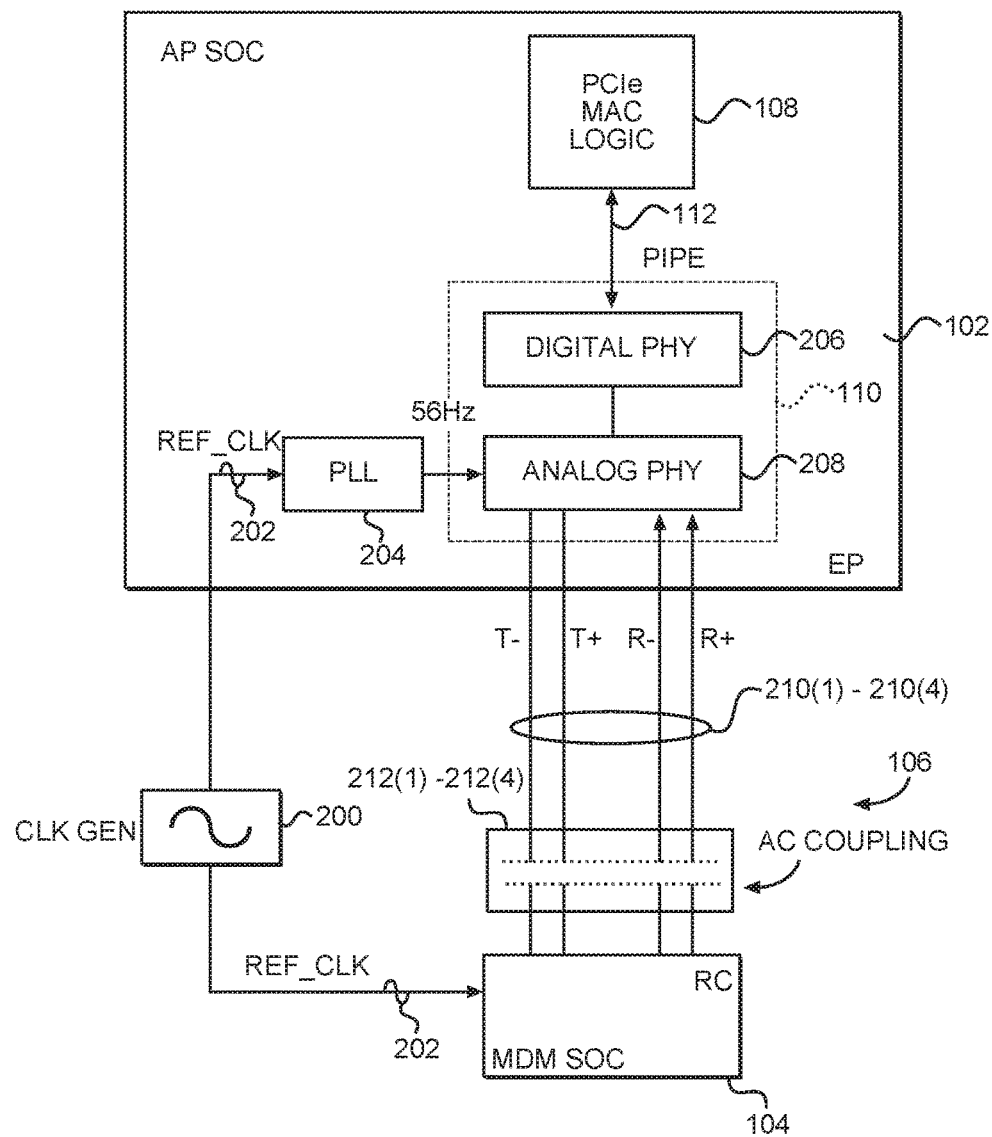
FIG. 2 is a more detailed block diagram of one of the ICs of FIG. 1 having an analog physical layer (PHY)
Figure 3:
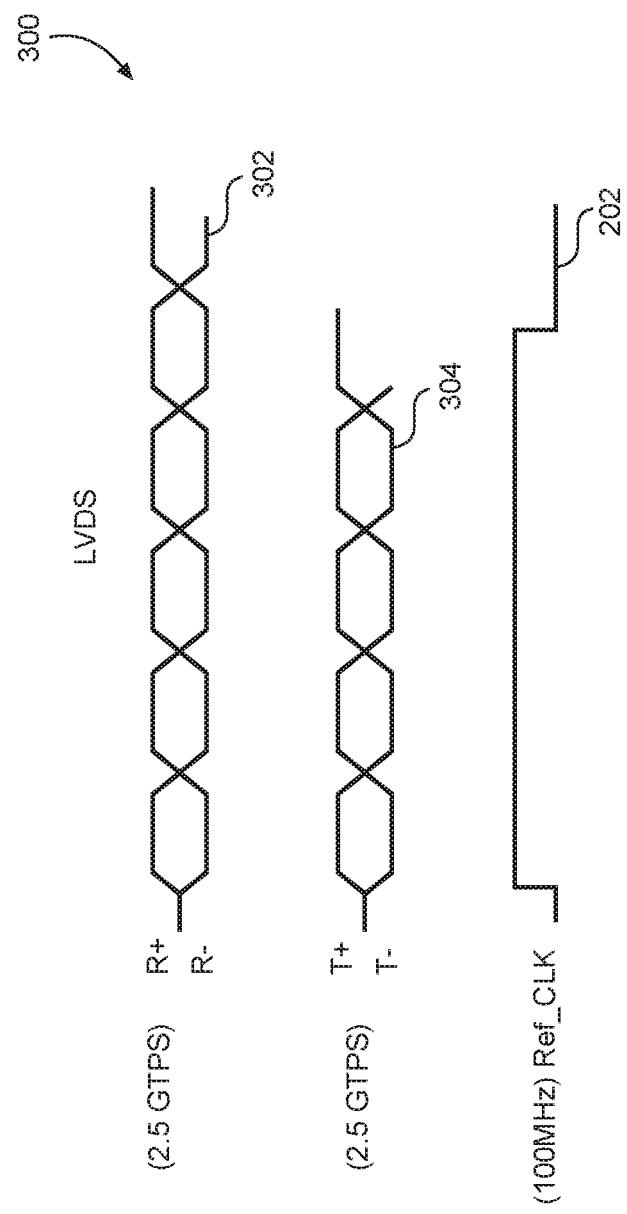
FIG. 3 is an exemplary signal versus clock diagram for the transmit and receive signals of the analog PHY of FIG. 2.
Figure 4:
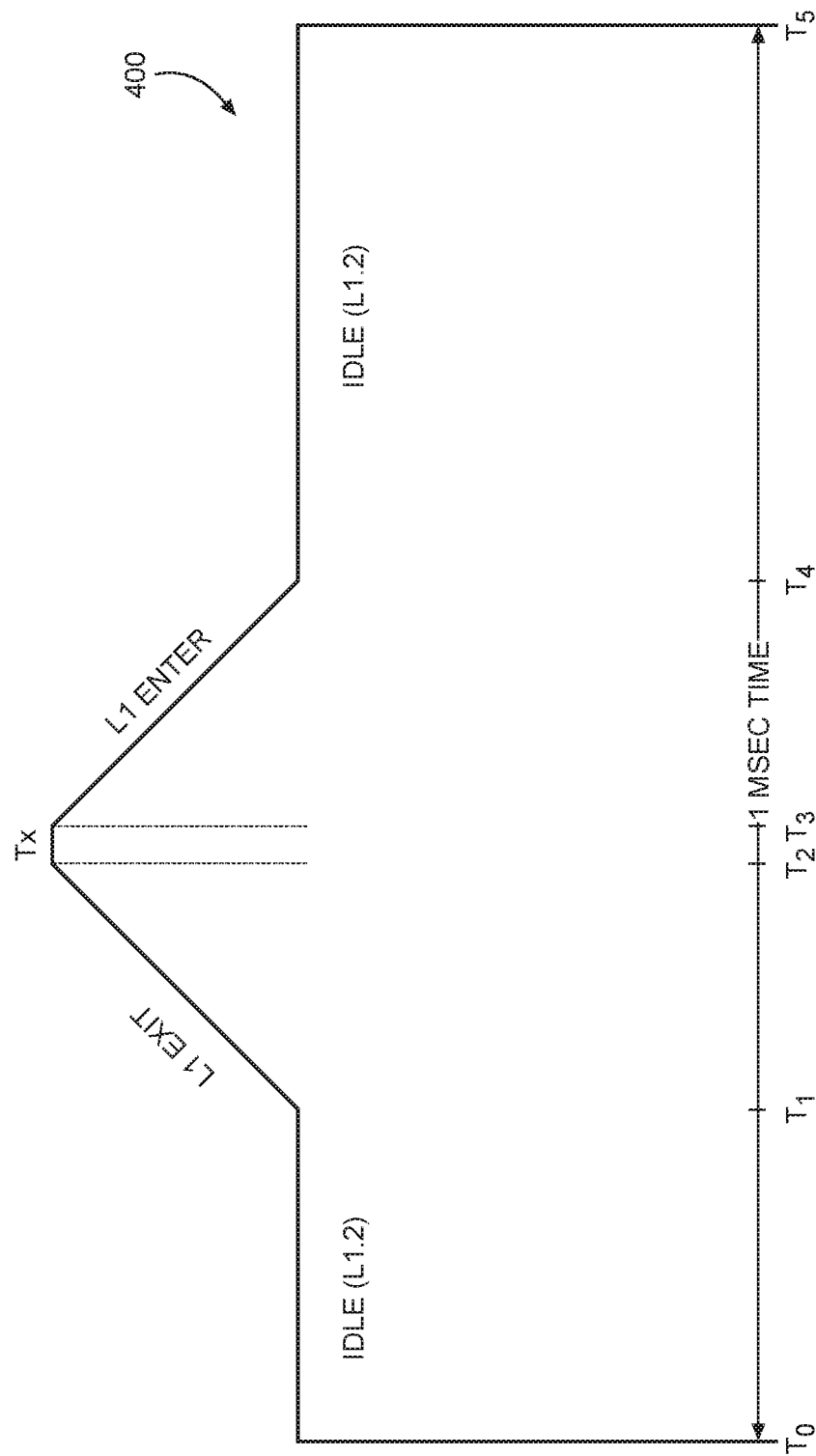
FIG. 4 is a timing diagram for the analog PHY of FIG. 2 entering and leaving a low-power mode.

Before addressing exemplary aspects of the present disclosure, an overview of a conventional PCIe system is provided beginning with reference to FIG. 1 with additional explanation provided with reference to FIGS. 2-4. A discussion of an exemplary PCIe system is provided below beginning with reference to FIG. 5.

In this regard, FIG. 1 is a block diagram of a conventional PCIe system 100. The PCIe system 100 includes a first integrated circuit (IC) 102, which may be an application processor (AP) system on a chip (SOC), and a second IC 104, which may be a mobile device modem (MDM) SOC. The first IC 102 is coupled to the second IC 104 through a PCIe bus 106. The PCIe bus 106 may be a differential bus. The first IC 102 may include a first MAC logic 108 and a first PHY 110 coupled by a first PHY Interface for PCI Express (PIPE) 112. The second IC 104 may include a second MAC logic 114 and a second PHY 116 coupled by a second PIPE 118. In the conventional PCIe system 100, the first PHY 110 and the second PHY 116 are analog PHYs designed to accommodate high speed and high bandwidth. It should be appreciated that under the PCIe nomenclature, one of the first IC 102 and the second IC 104 is a root complex (sometimes referred to herein as RC) and the other is an endpoint (sometimes referred to herein as EP).

FIG. 2 provides a more detailed block diagram of the components of the first PHY 110 within the first IC 102 of FIG. 1 as well as illustrating a reference clock 200 that supplies a clock signal Ref_CLK 202 to both the first IC 102 and the second IC 104. In the case of the first IC 102, the clock signal Ref_CLK 202 is passed to a phase locked loop (PLL) 204 which converts the clock signal Ref_CLK 202 to a high frequency (e.g., 2.5 GHz for PCIe generation 1, 5 GHz for PCIe generation 2, 8 GHz for generation 3) signal that is passed to the first PHY 110. The first PHY 110 includes a digital PHY component 206 and an analog PHY component 208. The digital PHY component 206 is coupled to the first PIPE 112, and passes the signal from the first MAC logic 108 via the first PIPE 112 to the analog PHY component 208. The analog PHY component 208 is coupled to conductors 210(1)-210(4) that form the PCIe bus 106. The conductors 210(1)-210(4) form a differential transmit (T+, T−) path and a differential receive (R+, R−) path. The conductors 210(1)-210(4) may include capacitors 212(1)-212(4) to allow for alternating current coupling, but stop direct current. As illustrated in FIG. 2, the first IC 102 is the EP and the second IC 104 is the RC.

In an exemplary aspect, the PCIe system 100 operates using a low-voltage differential signaling standard, which looks like signals 300 set forth in FIG. 3 where receive signal 302 and transmit signal 304 operate much faster than the clock signal Ref_CLK 202.

In practice, the PCIe system 100 will spend some portion of the time in a low-power mode, sometimes referred to as an idle mode or L1 state and/or L1 sub-states by the PCIe protocol. When the first IC 102 needs to send a signal to the second IC 104, the PCIe system 100 is moved from the L1 state (or from one of the L1 sub-states) to an L0 state, and transmission of data signals occurs. It should be appreciated that to reduce latency, data is generally accumulated for no more than one microsecond (based on an amount of data contained in a typical Long Term Evolution (LTE) frame and frame rate). That is, at least once every microsecond, the PCIe system 100 is put into the L0 state and data is sent. In some instances, the amount of data in a low-bandwidth application, such as an Internet of Things (IoT) or wearable wireless device, may be relatively low. In such an instance, the amount of time to wake the PCIe system 100 and the amount of time spent putting the PCIe system 100 back into the L1 state (or one of the L1 sub-states) is comparatively large relative to the time spent transmitting. Using a typical LTE system, one millisecond of such a situation is illustrated in time graph 400 of FIG. 4, where T0 reflects the beginning of the millisecond, and the PCIe system 100 is in one of the L1 sub-states; T1 reflects when the PCIe system 100 begins to wake; T2 represents when data transmission begins; T3 represents when data transmission ends; and T4 represents when the PCIe system 100 returns to the low-power L1 sub-state mode. The time T1 to T2 reflects time spent charging capacitors and letting the PLL 204 settle. Likewise, the time from T3 to T4 represents the time spent discharging capacitors and instructing various elements to return to the low-power L1 state (or L1 sub-state). It is not uncommon for more than 60 percent and sometimes as much as 90 percent of the power expended by the PCIe system 100 to be spent during the transitions. Having as much as 90 percent of the power being spent during transitions is common amongst low-speed communications. Such power consumption negatively impacts battery life and is generally not needed for low-power applications. While a particular L1 sub-state is illustrated in FIG. 4, it should be appreciated that comparable situations apply to other L1 sub-states and the L1 state. Likewise, different frame sizes and different frame rates may impact the precise ratios of time spent in low-power states to the L0 state, but the general concepts remain true. Accordingly, all such low-power modes may benefit from power savings according to the present disclosure.

Exemplary aspects of the present disclosure help reduce the transition times from low-power modes to high-power modes for low-speed communication by eliminating the analog PHY component and placing a serializer and deserializer in the digital PHY component. The digital PHY component is then coupled directly to the bus and single-ended communication is enabled. While all PCIe systems may potentially have power saving benefits from exemplary aspects of the present disclosure, by reducing the transition times, latency sensitive, low data rate applications may see the largest power savings without the need for buffering (especially since buffering likely would negatively impact latency).

Figure 5:
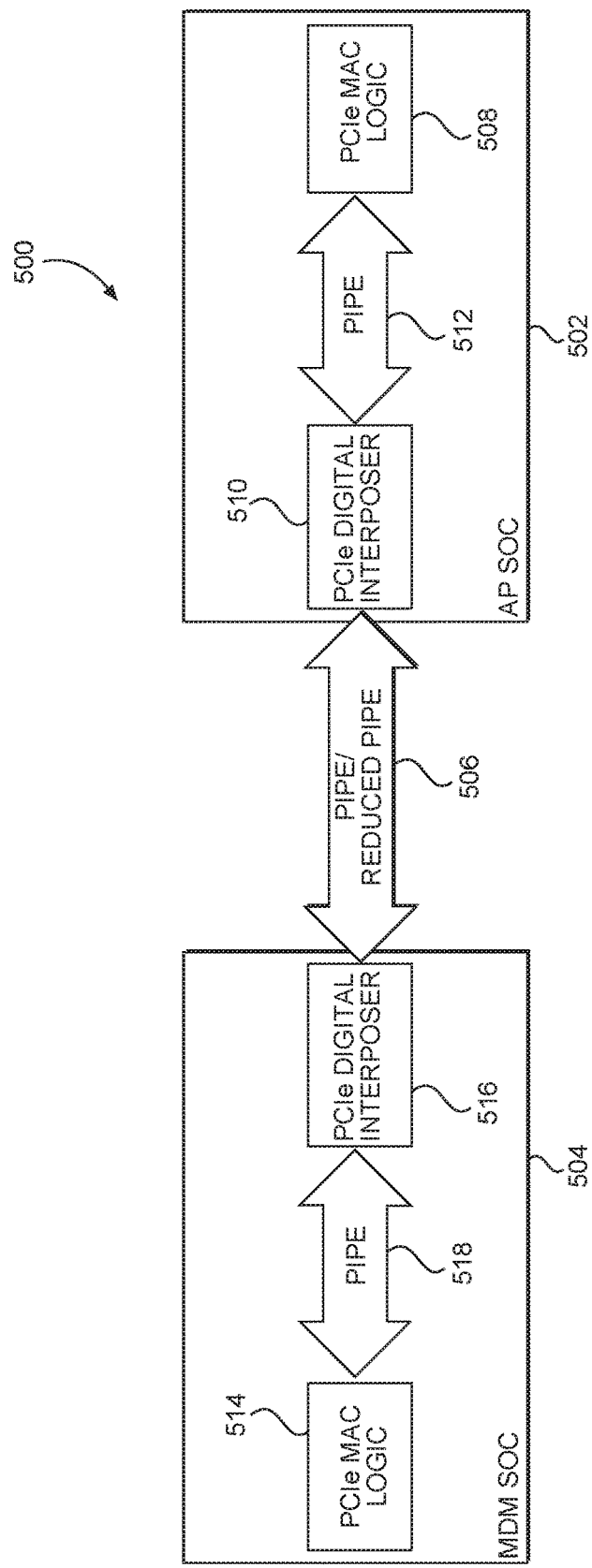
FIG. 5 is a block diagram of a PCIe system with two ICs coupled to one another across a PCIe bus using a digital PHY according to an exemplary aspect of the present disclosure.

In this regard, FIG. 5 illustrates a PCIe system 500 with digital PHYs and without the usual intervening analog PHY. In particular, the PCIe system 500 includes a first IC 502 and a second IC 504 coupled by a PIPE bus 506. The first IC 502 may be an AP SOC and the second IC 504 may be an MDM SOC. The first IC 502 includes a PCIe MAC 508 (sometimes referred to as a MAC logic) substantially identical to the first MAC logic 108 of FIG. 1. The first IC 502 further includes a digital PHY (sometimes referred to as a PCIe digital interposer) 510, which is coupled to the PCIe MAC 508 by a PIPE 512. The PIPE 512 may be substantially identical to the first PIPE 112 of FIG. 1 and may directly couple to the digital PHY 510 without an analog PHY interposed. The digital PHY 510 may be, as noted above, based on a CMOS logic structure and does not require a differential signaling circuit structure or use differential signaling. Likewise the digital PHY 510 is well suited for low-speed communication over the PIPE bus 506. As used herein the digital PHY 510 may sometimes be referred to as a means for sending digital signals to a low-speed communication bus.

With continued reference to FIG. 5, the second IC 504 may include a PCIe MAC 514 (also sometimes referred to as a MAC logic) substantially identical to the second MAC logic 114 of FIG. 1. The second IC 504 further includes a digital PHY (sometimes referred to as a PCIe digital interposer) 516, which is coupled to the PCIe MAC 514 by a PIPE 518. Again, the PIPE 518 may directly couple to the digital PHY 516 without an interposing analog PHY. The PIPE 518 may be substantially identical to the second PIPE 118 of FIG. 1. As with PCIe system 100, one of the first IC 502 and the second IC 504 is the RC and the other is the EP.

Figure 6:
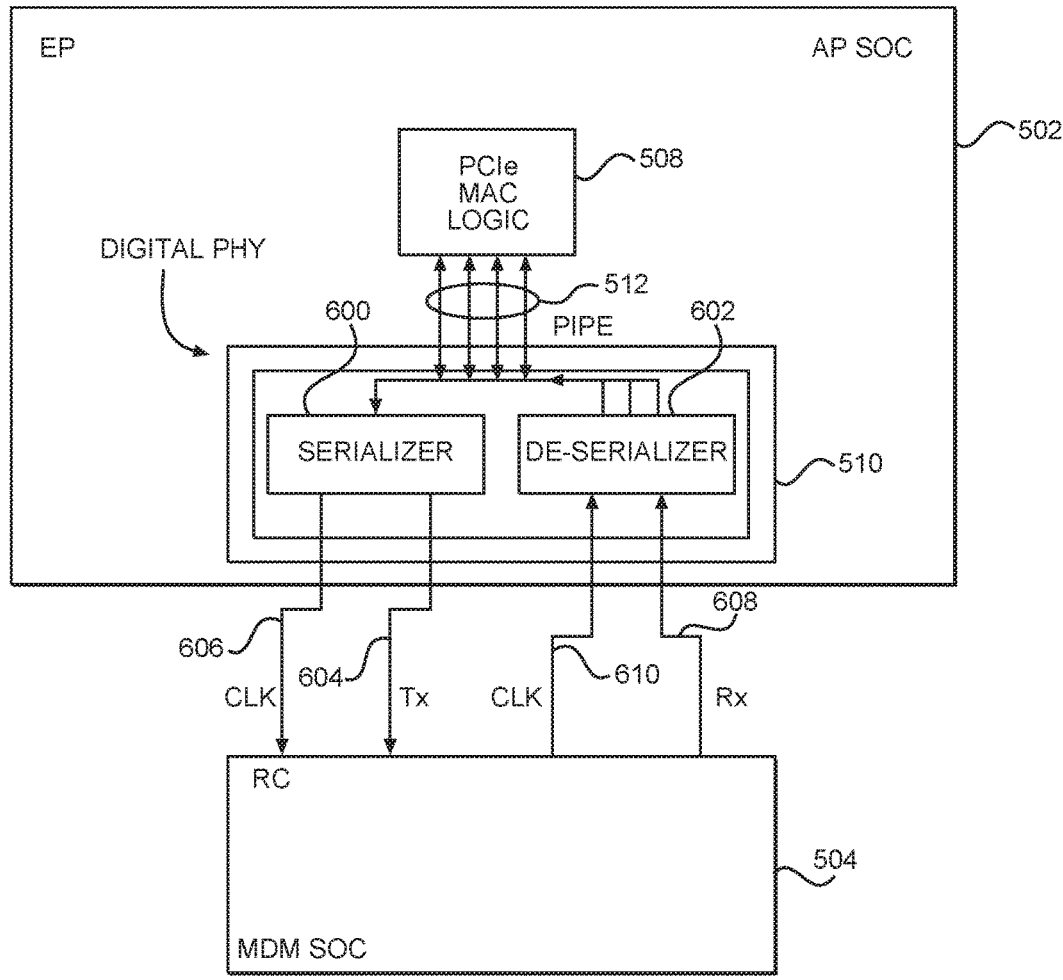
FIG. 6 is a more detailed block diagram of one of the ICs of FIG. 5 having a digital PHY according to an exemplary aspect of the present disclosure.

FIG. 6 provides a more detailed schematic of the elements within the first IC 502 and particularly shows the absence of any analog PHY. The PCIe MAC 508 couples to the PIPE 512 and communicates with the digital PHY 510. The digital PHY 510 includes a serializer 600 and a deserializer 602. The serializer 600 takes plural data lanes of the PIPE 512 and serializes them for transmission on a single conductor 604 to the second IC 504. A clock signal is also provided on a clock conductor 606. Notable is that no reference clock is required. The deserializer 602 receives serial data from a single conductor 608 and deserializes it into plural data paths on the PIPE 512. The deserializer 602 may also receive a clock signal on a second clock conductor 610.

The interested reader should appreciate that FIG. 6 includes the serializer 600 and the deserializer 602. When the serializer 600 and the deserializer 602 are present, the bus between the first IC 502 and the second IC 504 may be the single conductor 604 and the single conductor 608. One such exemplary bus is an I3C bus. Another exemplary bus is the virtual general purpose input/output (GPIO) (VGI) or Virtual GPIO and Messaging Interface (VGMI) promulgated by the MIPI Alliance. Another exemplary bus is a Universal Serial Bus (USB). Alternatively, and as illustrated in FIG. 5, if the bus is a parallel bus like a PIPE (or reduced PIPE) or Advanced eXtensible Interface (AXI) bus, the bus may include multiple parallel lines and the number of lines used may vary according to bandwidth needs. As used herein a reduced PIPE bus means that one can encode the PIPE using some data pattern for the control path. While this provides fewer signals, it still allows use of a digital interface as described herein.

As yet another alternative, the serializer 600 and deserializer 602 may be present but may act to pass through signals without serializing or deserializing. Such pass through arrangement would allow the digital PHY to be coupled to a parallel bus.

Figure 7:
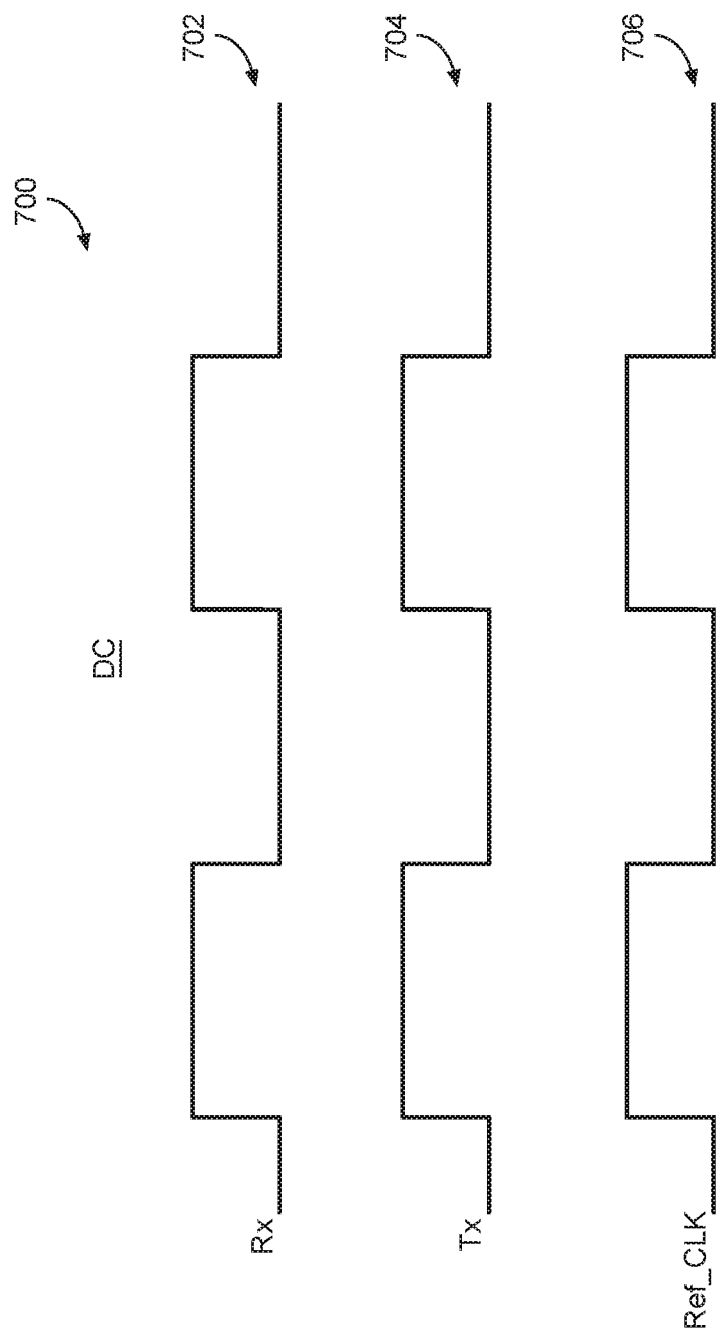
FIG. 7 is an exemplary signal versus clock diagram for the transmit and receive signals of the digital PHY of FIG. 5.

The PCIe system 500 operates using a CMOS protocol signaling standard, which looks like signals 700 set forth in FIG. 7, where receive signal 702 and transmit signal 704 operate at the same speed as clock signal 706. By having the data signals 700 and 702 operate at the same speed as the clock signal 706, no external clock is required. Likewise, there is no time required for a PLL to settle.

Figure 8:
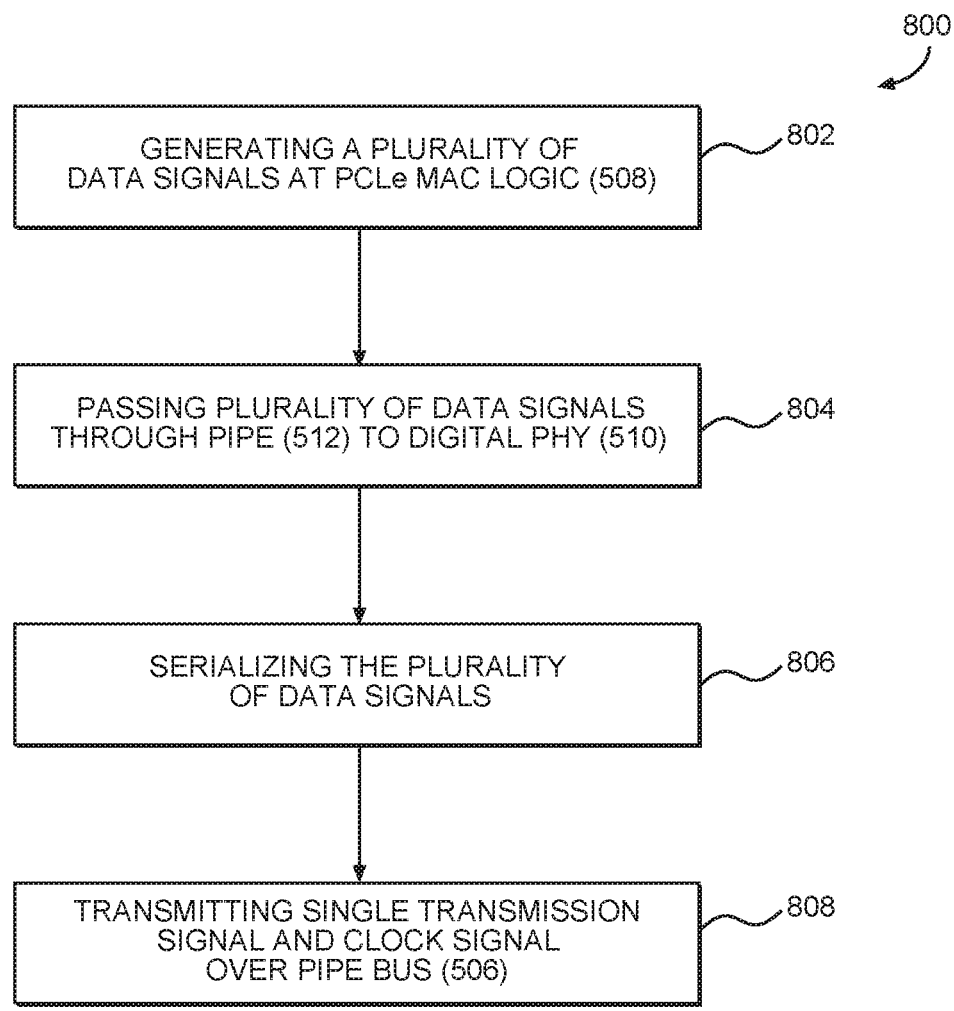
FIG. 8 is a flowchart illustrating a process for using the digital PHY of FIG. 5.

FIG. 8 provides a flowchart of process 800 associated with using the PCIe system 500 of FIG. 5 according to an exemplary aspect of the present disclosure. The process 800 begins by generating a plurality of data signals at the PCIe MAC 508 (block 802). The PCIe MAC 508 passes the plurality of data signals through the PIPE 512 to the digital PHY 510 (block 804). The plurality of data signals are passed over parallel data paths in the PIPE 512. At the digital PHY 510, the serializer 600 serializes the plurality of data signals (block 806). The digital PHY 510 then transmits a single transmission signal and a clock signal over the PIPE bus 506 (block 808).

While the present disclosure assumes that the techniques used herein may be used as a primary power-saving technique, it should be appreciated that the present disclosure is not mutually exclusive of other power-saving techniques and may be used with hierarchical devices and/or the use of a switch.

The replacement PHY for low-speed PCIe systems according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
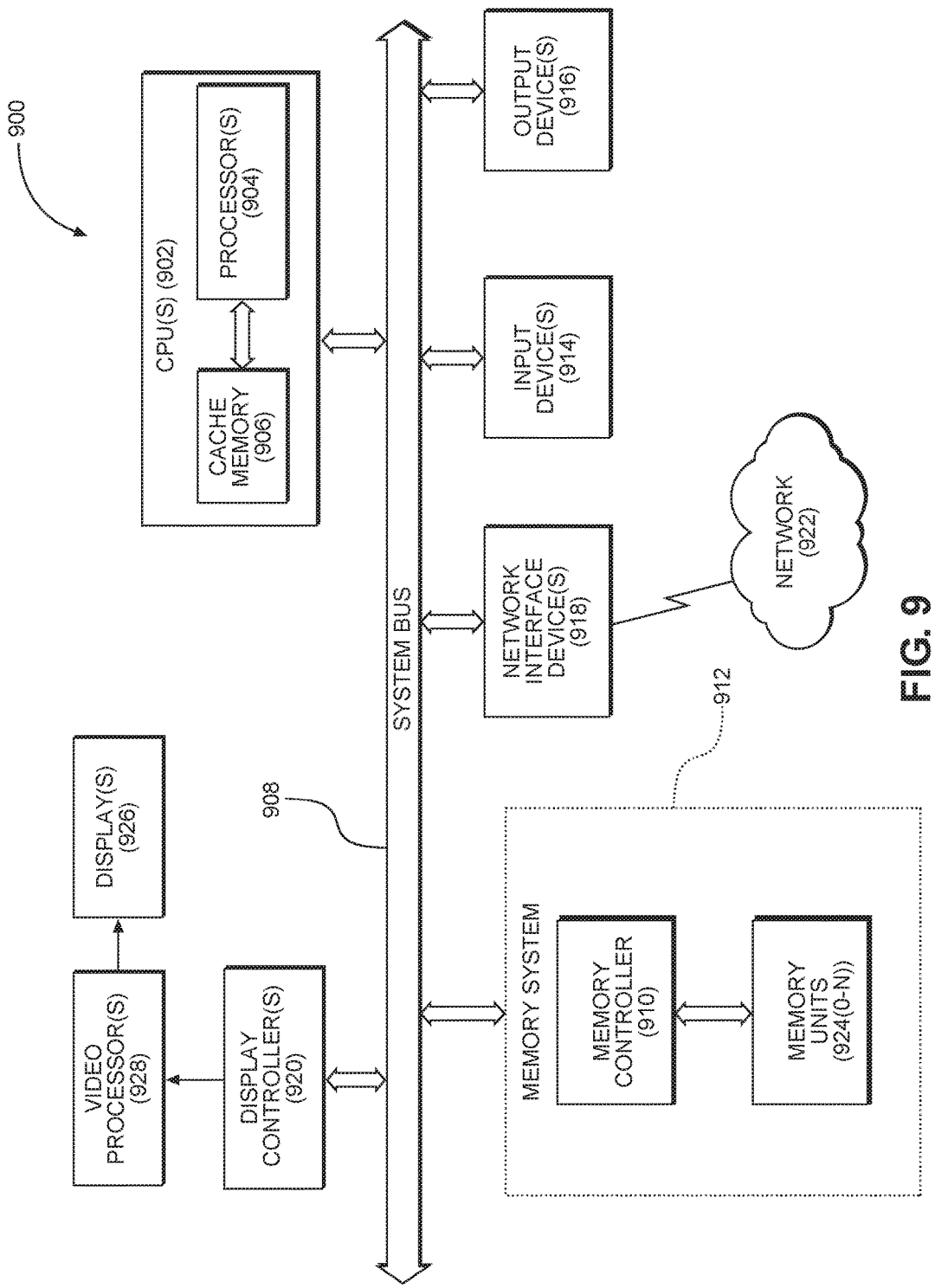
FIG. 9 is a block diagram of an exemplary processor-based system that can include the IC and digital PHY of FIG. 5.

In this regard, FIG. 9 illustrates an example of a processor-based system 900 that can employ the ICs 502 and 504 and digital PHYs 510 and 516 illustrated in FIG. 5. In this example, the processor-based system 900 includes one or more central processing units (CPUs) 902, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 912, one or more input devices 914, one or more output devices 916, one or more network interface devices 918, and one or more display controllers 920, as examples. The input device(s) 914 can include any type of input device, including, but not limited to, input keys, switches, voice processors, etc. The output device(s) 916 can include any type of output device, including, but not limited to, audio, video, other visual indicators, etc. The network interface device(s) 918 can be any devices configured to allow exchange of data to and from a network 922. The network 922 can be any type of network, including networks such as the phone network and the Internet. The network interface device(s) 918 can be configured to support any type of communications protocol desired. The memory system 912 can include one or more memory units 924(0-N).

The CPU(s) 902 may also be configured to access the display controller(s) 920 over the system bus 908 to control information sent to one or more displays 926. The display controller(s) 920 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC) having only a digital physical layer (PHY) for Peripheral Component Interconnect (PCI) communications comprising:
   a PCI Express (PCIe) media access control (MAC) logic;
   a PHY interface for a PHY interface for PCIe (PIPE) communicatively coupled to the PCIe MAC logic; and
   the digital PHY directly communicatively coupled to the PIPE and configured to be coupled to a bus for low-speed communication.

2. The IC of claim 1, wherein the digital PHY comprises a complementary metal oxide semiconductor (CMOS) digital PHY.

3. The IC of claim 1, wherein the digital PHY comprises a serializer and a deserializer, wherein the serializer is configured to output a transmission data signal and a clock signal to the bus.

4. The IC of claim 3, wherein the deserializer is configured to receive a signal from a remote IC comprising a received data signal and a received clock signal from the bus.

5. The IC of claim 3, wherein the serializer is configured to serialize plural data paths of the PIPE.

6. The IC of claim 4, wherein the deserializer is configured to deserialize the received data signal into plural data paths for the PIPE.

7. The IC of claim 3, wherein the digital PHY is configured to couple to an I3C bus or a virtual general purpose input/output (VGI) bus.

8. The IC of claim 1, wherein the digital PHY is configured to couple to a PIPE bus.

9. The IC of claim 1, wherein the digital PHY is configured to couple to a reduced PIPE bus.

10. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner;

a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A method of communicating over a bus, comprising:
generating a plurality of data signals at a media access control (MAC) logic;
passing the plurality of data signals through a physical layer (PHY) interface for Peripheral Component Interconnect (PCI) Express (PCIe) (PIPE) to a digital PHY; and
transmitting a digital signal over a low-speed communication bus.

12. The method of claim 11, wherein transmitting over the low-speed communication bus comprises transmitting over an I3C bus.

13. The method of claim 11, wherein transmitting over the low-speed communication bus comprises transmitting over a PIPE bus.

14. The method of claim 11, wherein transmitting over the low-speed communication bus comprises transmitting over a reduced PIPE bus.

15. The method of claim 11, further comprising serializing the plurality of data signals.

16. The method of claim 11, further comprising receiving digital signals from the low-speed communication bus.

17. The method of claim 16, further comprising deserializing the digital signals from the low-speed communication bus.

18. The method of claim 16, wherein transmitting comprises using a complementary metal oxide semiconductor (CMOS)-based PHY to transmit.

19. An integrated circuit (IC) having only a digital physical layer (PHY) for Peripheral Component Interconnect (PCI) communications comprising:
a PCI Express (PCIe) media access control (MAC) logic;
a PHY interface for a PHY interface for PCIe (PIPE) communicatively coupled to the PCIe MAC logic; and
a means for sending digital signals to a low-speed communication bus, the means for sending directly communicatively coupled to the PIPE.

* * * * *